United States Patent [19]

Nakamura

[11] Patent Number: 4,464,656
[45] Date of Patent: Aug. 7, 1984

[54] WAVEFORM DISPLAY APPARATUS

[75] Inventor: Masakazu Nakamura, Gyoda, Japan

[73] Assignee: Takeda Riken Kogyo Kabushiki Kaisha, Tokyo, Japan

[21] Appl. No.: 297,260

[22] Filed: Aug. 28, 1981

[30] Foreign Application Priority Data

Aug. 29, 1980 [JP] Japan .................................. 55-120113

[51] Int. Cl.³ .............................................. G09G 1/00
[52] U.S. Cl. .................................... 340/728; 340/721; 340/722; 340/734; 340/729
[58] Field of Search ............... 340/728, 721, 722, 729, 340/734, 747

[56] References Cited

U.S. PATENT DOCUMENTS

| | | | |
|---|---|---|---|
| 3,603,963 | 9/1971 | Ward | 340/729 |
| 3,725,901 | 4/1973 | Lehari et al. | 340/722 |
| 3,778,811 | 12/1973 | Gicca et al. | 340/722 |
| 4,119,956 | 10/1978 | Murray | 340/728 |
| 4,208,723 | 6/1980 | Lecklider | 340/728 |
| 4,272,767 | 6/1981 | Lacy | 340/722 |
| 4,295,135 | 10/1981 | Sukonick | 340/721 |
| 4,307,393 | 12/1981 | Hamada et al. | 340/722 |

Primary Examiner—Marshall M. Curtis
Attorney, Agent, or Firm—Staas & Halsey

[57] ABSTRACT

An analog waveform is sampled and converted into a digital form corresponding to the number of picture elements in the direction of main scanning of a raster scanning type display unit. The digital value thus obtained is stored in a memory which has the same number of addresses as the above-mentioned number picture elements. All memory locations are sequentially read out, for each main scan of the display unit. The data $A_1$ contained in each location is compared to the number of the current scanning line $B_1$ of the display unit. When the data read out, $A_1$, equals the number, $B_1$, a video signal is applied to the display unit, resulting in a bright spot being displayed on the display surface of the display unit. When a waveform video signal is formed, corresponding to the states of $A=B$ or $A>B$, the area under the waveform is displayed by dots.

The waveform display apparatus includes an apparatus for obtaining a digital value $A'$ read from the memory at an address immediately preceding the address from which the digital value $A$ is read out, comparing apparatus for detecting the states of $A=B$, $A>B$ and $A'>B$, and apparatus for detecting non-coincidence between $A>B$ and $A'>B$. When the video signal is formed using the $A=B$ states, and the non-coincidence between $A>B$ and $A'>B$, dots displaying a waveform are interpolated by additional dots to display the waveform as a continuous line.

30 Claims, 27 Drawing Figures

FIG. 1
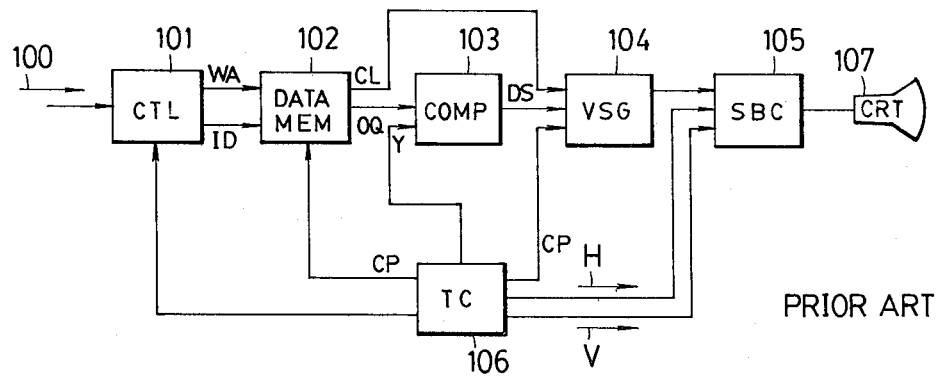
PRIOR ART
PRIOR ART
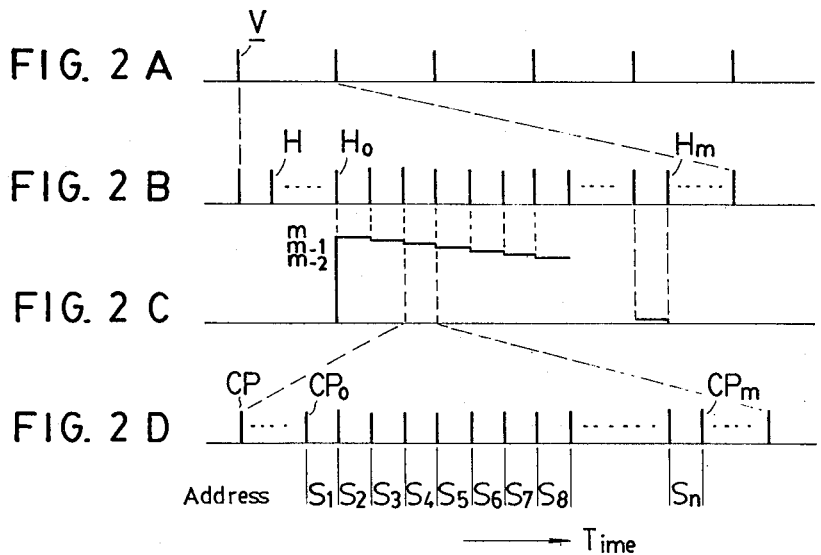

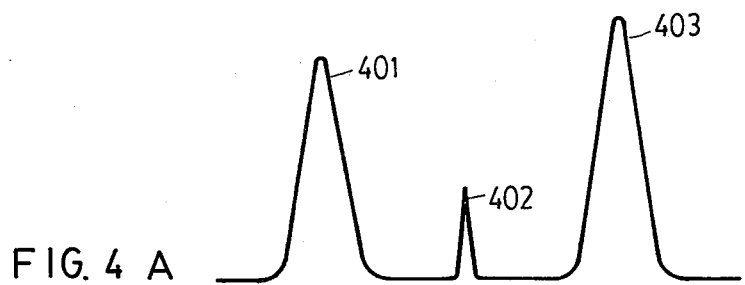
FIG. 4 A
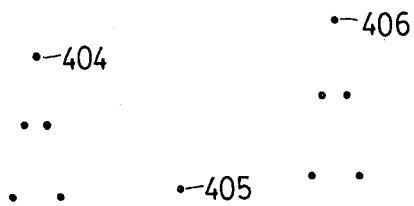
FIG. 4 B
FIG. 5
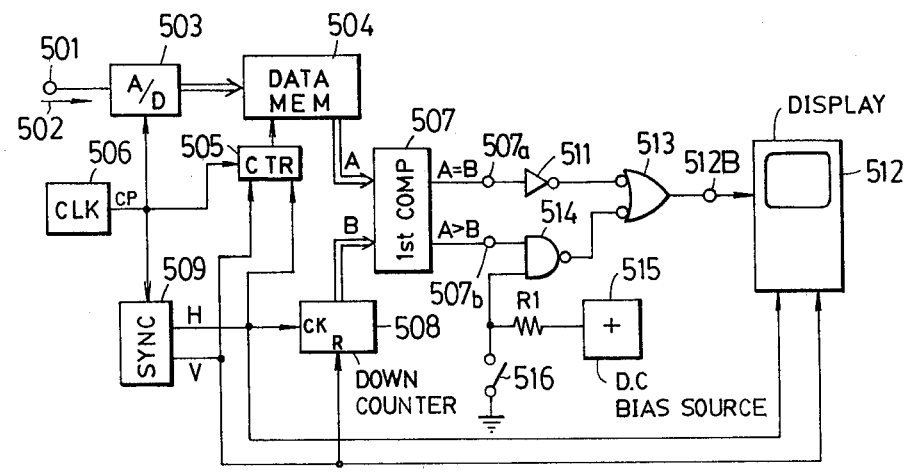

| MSB | 0 | 0 | 0 | 0 | 0 | 0 | 0 | 0 | 0 |
|---|---|---|---|---|---|---|---|---|---|
| | 0 | 0 | 0 | 0 | 0 | 0 | 0 | 0 | 0 |
| | 0 | 0 | 0 | 0 | 0 | 0 | 0 | 0 | 0 |
| | 0 | 0 | 0 | 0 | 0 | 0 | 0 | 0 | 0 |
| | 0 | 0 | 0 | 0 | 0 | 0 | 0 | 0 | 0 |
| | 0 | 0 | 0 | 0 | 0 | 0 | 0 | 0 | 0 |
| | 0 | 0 | 0 | 0 | 1 | 1 | 1 | 1 | |
| | 1 | 1 | 1 | 1 | 0 | 0 | 1 | 1 | |
| LSB | 0 | 0 | 0 | 1 | 0 | 1 | 0 | 0 | |

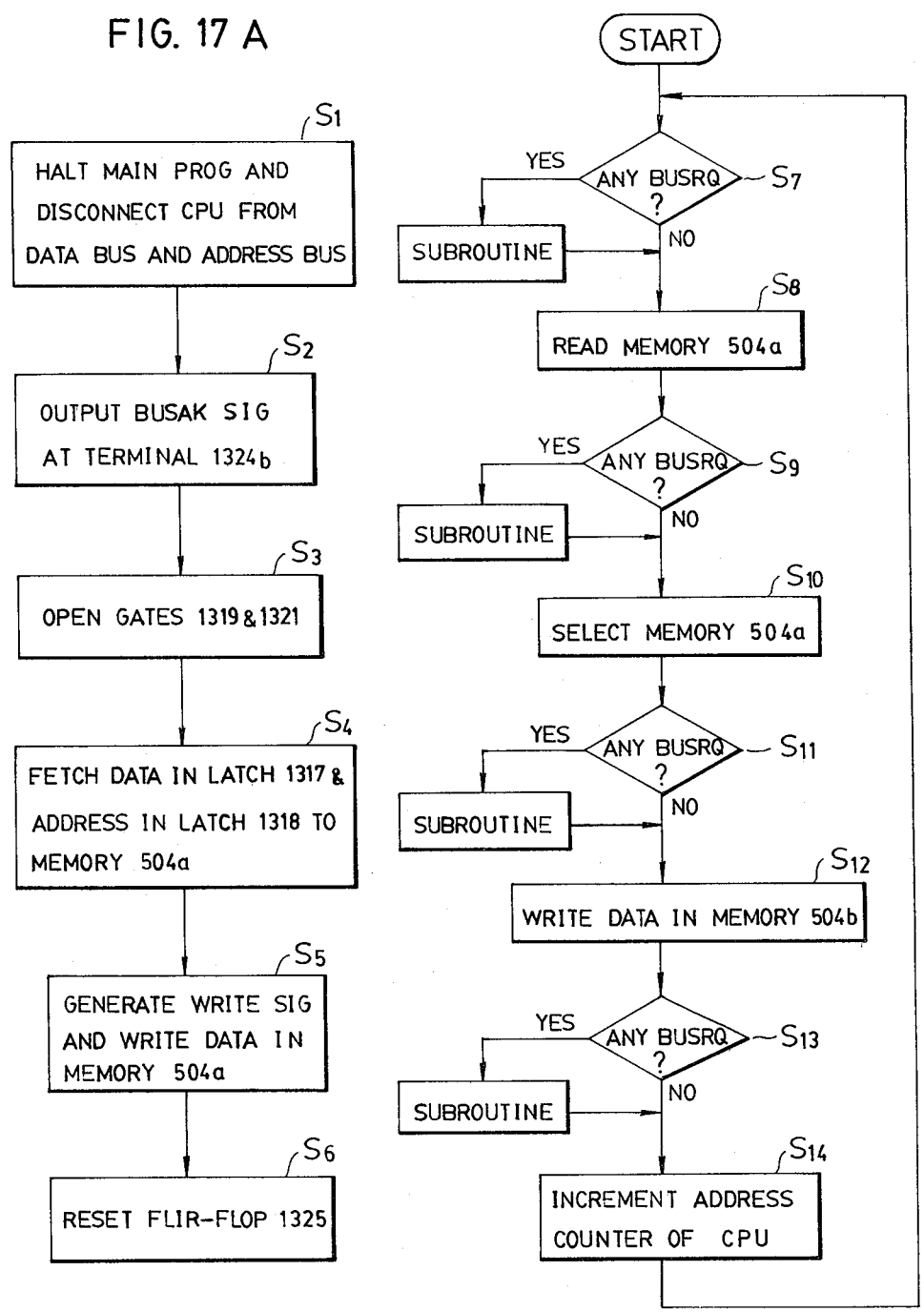

WAVEFORM DISPLAY APPARATUS

BACKGROUND OF THE INVENTION

The present invention relates to a waveform display apparatus of the type in which analog waveform data is converted to digital data, and then temporarily stored in a memory. The converted analog waveform is read out from the memory and displayed on a raster scanning type display unit.

A waveform display apparatus formed by the combined use of a memory and a raster scanning type display unit is excellent in that when analog data is temporarily stored in a memory, the data can be reproduced repeatedly. Further, since it employs the raster scanning type display unit, it has the advantage that a character or the like can also be displayed along with the waveform.

This type of waveform display apparatus requires a memory which has the capacity to store all one frame picture elements. Therefore, in order to enhance the resolution of a waveform display, it is necessary to use a memory of increased storage capacity. Even when such a memory is employed, the number of memory elements actually used for storing an analog waveform is so small that there is a very low efficiency in the utilization of the memory.

Japanese Patent Application No. 51-9114, Laid Open Feb. 16, 1978 discloses a graphic display device designed to display an analog waveform using a small storage capacity memory. This graphic display device employs a memory which has the same number of addresses as the number of picture elements into which the display surface of a display unit is divided in the main scanning direction of raster scanning. A-D converted analog data values to be displayed are sequentially stored in the memory in address order; the memory is read out in synchronism with each picture element for each raster scan; the data thus read out is compared with the number of the raster; and upon each coincidence between them, a dot is displayed.

The known graphic display device described above has a resolution corresponding to the number of picture elements in the main scannng direction of raster scanning (for example, in the X-axis direction) and a resolution corresponding to the number of scanning lines in the direction perpendicular to the main scanning direction (i.e. in the Y-axis direction). Consequently, an analog waveform which varies relatively gently can be displayed as a continuous analog waveform. But in the case of displaying an analog waveform which varies steeply and greatly in the Y-axis direction, adjacent dots displaying the waveform are greatly spaced apart, making the display difficult to analyze.

To facilitate a better understanding of the present invention, a description is presented, with reference to FIGS. 1 to 3, of the conventional waveform storage apparatus disclosed in the Japanese Patent Application No. 51-9114, Laid Open Feb. 16, 1978.

Controller 101 writes into data memory 102, data 100 provided from an external computer or the like. Data memory 102 has the same number of addresses as picture elements, aligned in the direction of raster on the display surface of display unit 107 employing a raster scanning type, for example, electromagnetic deflection type cathode ray tube. The data stored in data memory 102 is sequentially read out by a signal from timing controller 106 for each raster scan.

A numerical signal $\overline{DQ}$ corresponding to the data read out of data memory 102, is provided to comparator 103 and a color specifying signal CL is applied to color video signal generator 104. Comparator 103 compares the numerical signal $\overline{DQ}$ with a raster scanning line number Y supplied from timing controller 106 and yields, for example, a high, "H" or low, "L" logic signal DS depending respectively on whether or not the numbers are equal.

Color video signal generator 104 produces a color video signal based on the color specifying signal CL read out of data memory 102, the output signal DS from comparator 103 and a timing signal CP from the timing controller 106. The color video signal is applied to synchronous brightness controller 105. The synchronous brightness controller 105 controls, in accordance with the color video signal and a timing signal, display unit 107 to provide a video display.

The operation of the apparatus is as follows. Timing controller 106 supplies synchronous brightness controller 105 with a vertical synchronizing signal V and a horizontal synchronizing signal H depicted in FIGS. 2A and 2B, respectively. Further, timing controller 106 supplies comparator 103 with a raster number shown in FIG. 2C, and supplies data memory 102 and color video signal generator 104 with a clock signal CP as depicted in FIG. 2D.

On the display surface of display unit 107 there is provided an effective display area for producing an analog display. The effective display area is defined by two rasters Ho and Hm in the Y-axis direction and by two picture-element positions, that is, clock pulses CPo and CPm in the X-axis direction (a raster-scanning direction). Rasters in the effective display area are given raster numbers m, m−1, m−2, ... in a sequential order.

In FIG. 2C, the raster numbers m, m−1, m−2, ... are shown to vary in a stairstep manner in analog form but, in practice, they are provided as digital signals. During the scanning of one raster, the same number of clock pulses CP are generated as there are picture elements in the direction of the raster and, data memory 102 is read out by those clock pulses lying in the effective display area. The data read out from addresses $S_1$ to $S_n$ of data memory 102 is compared by comparator 103 with the raster number, and when the address and raster number are equal, comparator 102 produces the "H" logic level output. The "H" logic level output is converted by color video signal generator 104 to a spot signal of a specified color. The spot signal is applied via synchronous brightness controller 105 to display unit 107. Therefore, for each application of the spot signal to display unit 107, a spot is displayed on the display surface at one of the positions corresponding to the addresses $S_1$ to $S_n$ of data memory 102, as depicted in FIG. 3. For example, if the data stored in data memory 102 at addresses $S_{10}$ and $S_{20}$ is $Y_1$ as shown in FIG. 3, then the data stored at each of these addresses are detected to be equal at the time of scanning the raster having a raster number $Y_1$, and a spot display is produced.

The raster scanning takes place sequentially, changing the raster number from the upper limit to the lower limit of effective display area. Accordingly, all data having a value in the effective display area is displayed in the form of spots; that is, an analog waveform is displayed by the spots.

With the above-described apparatus, it is sufficient that data memory 102 has the same number of addresses as the picture elements in the direction of the raster. Accordingly, the capacity of data memory 102 is a few hundredths of the capacity of a conventional refresh memory which is required to be equal to the total number of picture elements of one picture frame. Further, the data to be stored in data memory 102 may be in the form of digital signals, that is, they need not be converted to picture signals, so that no pattern generator is required. Therefore, the storage system is greatly simplified.

When this conventional waveform display is utilized in a spectrum analyzer, it displays the frequency spectra of electric waves or frequency characteristics of circuit elements. As a result, the spectrum analyzer often displays waveforms such as depicted in FIG. 4A, which have abrupt changes in the Y-axis direction. When waveforms 401, 402 and 403 shown in FIG. 4A are displayed using the apparatus described above, the adjacent dots or picture elements are greatly spaced in the Y-axis direction as shown in FIG. 4B. This makes recognition of the display difficult. This is especially true for waveforms such as 402, which rise and fall very sharply with narrow pulse width. This results in displays such as shown in FIG. 4B, where only one dot, 405, in the vicinity of the waveform peak is displayed. Display of such a single, small dot 405 is likely to be overlooked, introducing the possibility of serious measurement errors. Additionally, when waveforms with small rise times, such as those shown in FIG. 4A, 401, 402 and 403, are sampled at equal time intervals, the peak points of the waveforms are not always sampled. Therefore, even if the waveforms are displayed based on the data read out from data memory 102 as depicted in FIG. 4B, the uppermost dots 404, 405 and 406 of the respective waveforms do not necessarily indicate the peak values of the corresponding analog waveform. Accordingly, the prior art apparatus has the defect that the magnitude of the spectrum may not be accurately reproduced.

SUMMARY OF THE INVENTION

It is an object of the present invention to provide a waveform display apparatus designed so that an analog waveform, even if it varies steeply in the Y-axis direction can be displayed in a continuous form by interpolating dots to display its contour.

Another object of the present invention is to provide a waveform display apparatus which is capable of displaying the area under or the area over an analog waveform by bright spots, to facilitate easy and accurate observation of the waveform being displayed.

Another object of the present invention is to provide a waveform display apparatus which is suitable for displaying an analog waveform obtainable in synchronism with a ramp voltage, for example, as in a spectrum analyzer.

Another object of the present invention is to provide a waveform display apparatus which is capable of displaying analog waveform data previously stored in a memory and subjected to arithmetic processing.

Another object of the present invention is to provide a waveform display apparatus which is capable of superimposing a scale on an analog waveform by electrically producing a scale signal together with the analog waveform.

Yet another object of the present invention is to provide a waveform display apparatus which is capable of displaying a character or the like along with an analog waveform.

The present invention is similar to the aforesaid prior art display device in that a memory having the same number of addresses as picture elements is used for storing the waveform data to be displayed. The display surface of the raster scan display unit is divided into picture elements in the direction of its main scanning i.e. in the horizontal direction. Also, a waveform video signal is provided upon each coincidence between the output read out from the memory and the number of the scanning line.

The apparatus of the present invention is adapted so that upon each coincidence between the output read out from the memory and the number of the horizontal scanning line, a video signal is produced and, at the same time, a video signal for displaying the area underlying the displayed waveform is also yielded. This underlying display feature is switch selectable. By combining these two video signals, the entire area under or over the waveform being displayed can be displayed by dots. Therefore, even if dots displaying the waveform are greatly spaced apart, the contour of the waveform can be clearly displayed.

The video signal to display the area above or below the displayed waveform is produced by a magnitude comparator. If the waveform data read out from the memory and the number of the horizontal scanning line are represented by A and B, respectively, the comparator then yields an output when A<B or A>B.

The present invention is also capable of producing, in addition to the waveform video signal obtainable when A=B, video signals for interpolating dots displayed by such waveform video signals. That is, if A' represents waveform data read out from the memory at an address immediately preceding the address from which the waveform data A is read out, a second magnitude comparator compares the waveform data A' with the number of the horizontal scanning line to yield an output when A'<B or A'>B. The video signals produced when the outputs of the first and second magnitude comparators are in coincidence or non-coincidence can be used as the interpolating video signal.

By combining the interpolating video signal with the displayed waveform video signal, interpolating dots are inserted between the dots for waveform scanning use, thereby displaying the waveform in a continuous form.

The apparatus of the present invention is further capable of displaying a character or the like along with a waveform. A character or the like can be displayed on the raster scanning type display unit by the employment of known techniques. When displaying a character or the like, especially when the entire area under or over the waveform is displayed by dots, the character or the like cannot be read if displayed in such an area. This is because the dots comprising the character are of the same intensity as the dots filling the area above or below the displayed waveform. The present invention overcomes this problem by reducing the brightness of the displayed waveform and the dots filling the area above or below the waveform relative to the brightness of the dots comprising the character or the like. This is accomplished by chopping the video signals of the displayed waveform and the dots filling the area above or below the displayed waveform by clock pulses, thus reducing their mean duration and therefore their brightness.

Thus, the character or the like can be displayed at any place on the display surface of the display unit. It is also possible to chop the character video signal instead of the video signals of the displayed waveform and the dots filling the area above or below the displayed waveform.

BRIEF DESCRIPTION OF THE DRAWINGS

FIG. 1 is a block diagram showing a conventional waveform display apparatus;

FIGS. 2A, 2B, 2C, and 2D show waveforms for illustrating the operation of the apparatus of FIG. 1;

FIGS. 4A and B show waveforms illustrating a defect in the display of the conventional waveform display apparatus of FIG. 1;

FIG. 5 is a block diagram illustrating a first embodiment of the waveform display apparatus of the present invention;

FIG. 10 is a block diagram illustrating a third embodiment of the present invention;

FIG. 12 is a front view of the display surface of a display unit on which a scale is displayed by scale signal generating means added to the waveform display apparatus of the present invention;

FIGS. 17A and 17B are flow charts illustrating the operations performed by the input circuit CPU of FIG. 13.

DESCRIPTION OF THE PREFERRED EMBODIMENTS

Figure 3:
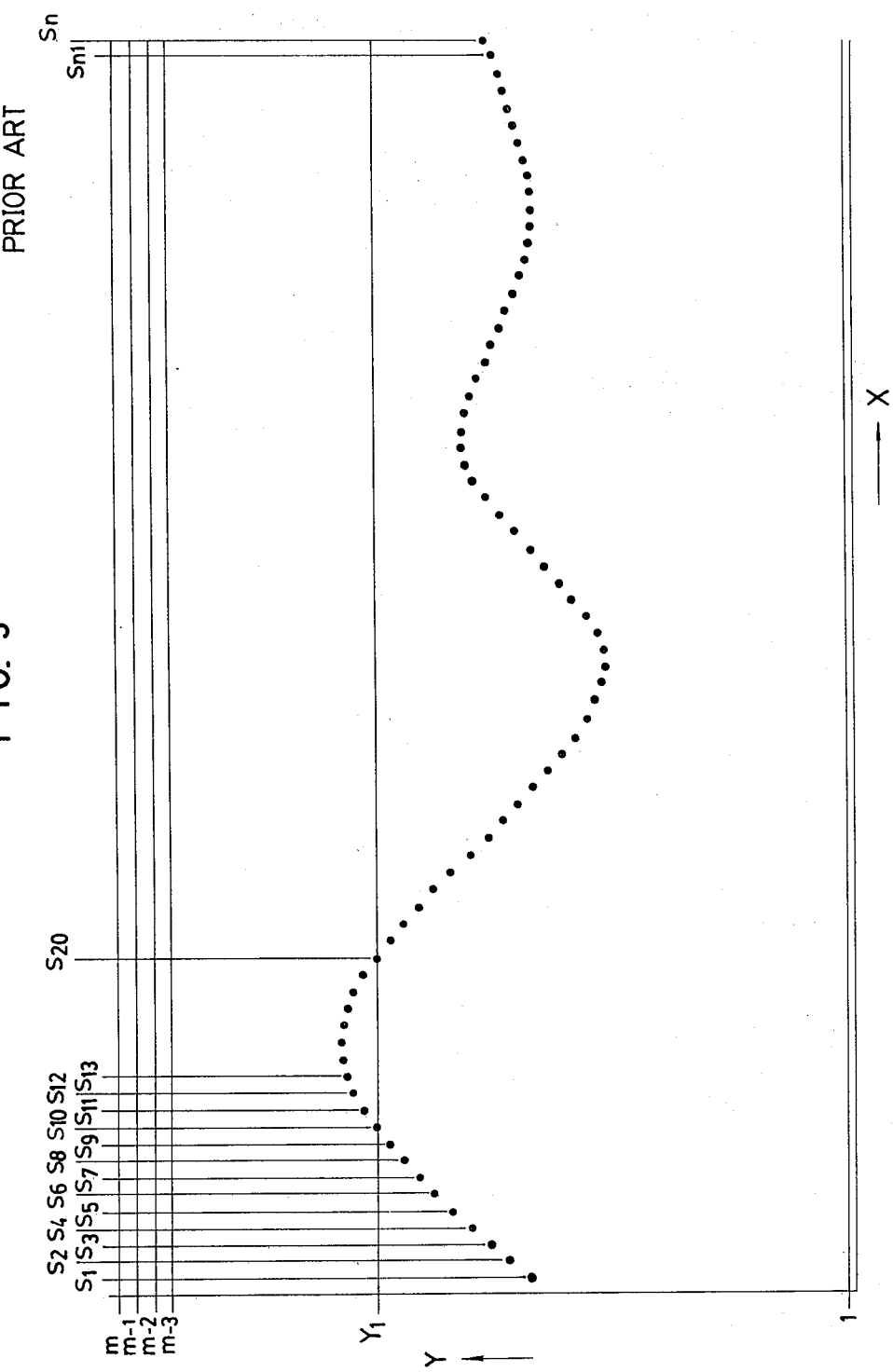
FIG. 3 is a waveform diagram showing an example of a display produced by the conventional waveform display apparatus of FIG. 1.

FIG. 5 illustrates a waveform display apparatus in accordance with a first embodiment of the present invention. An analog input signal 502 is applied via input terminal 501 to A-D converter 503, wherein each sampled point of input signal 502 is converted into a nine-bit, weighted code representing one of the scanning lines. For example, one of the 512 horizontal scanning lines depicted in FIGS. 6A and 6B. The A-D conversion is performed at a speed 1000 times faster than the horizontal scanning speed of a cathode ray tube. The output of A-D converter 503 is stored in data memory 504. A detailed description of how data is written into the data memory 504, is given below. Address counter 505 counts clock pulses from clock pulse source 506, to generate address signals applied to the data memory, 504. Address counter 505 is reset by horizontal and vertical synchronizing signals H and V which are derived from synchronizing signal source 509, described below. After storing the waveform data from A-D converter 503 for one frame, the readout operation takes place.

Waveform data A, read out of data memory 504, is provided to a first comparator 507. Comparator 507, is also supplied with a nine-bit digital code corresponding to the number of the main scanning line, that is, the horizontal scanning line number. This code is generated by, for example, down counter 508, upon completion of each sub-scanning or vertical scanning, a count of 511 is preset in counter 508 and the preset value is decremented in dependence upon the horizontal synchronizing signal H supplied by synchronizing signal source 509. The decremented content B, of the counter is applied to the first comparator 507.

The synchronizing signal source 509 generates the vertical synchronizing signal V and the horizontal synchronizing signal H. These signals are applied to a deflection circuit of a raster scanning type display unit 512. Down counter 508 is reset by the vertical synchronizing signal V causing a preset value to be stored in counter 508.

The first comparator 507 derives at its first output terminal 507a an output, for example, an "H" logic level output when the data A from data memory 504 and the count content B of counter 508 are equal, that is, when A=B, and at the second output terminal 507b is an "H" logic level when A>B. A comparator for performing these operations can be implemented by, for example, a Texas Instruments Inc. SN74S85N comparator. The output at the first output terminal 507a, after being inverted by invertor 511, is applied via NOR gate 513 to a brightness modulating terminal 512B of display unit 512. The other input terminal of NOR gate 513 is supplied by the second output terminal 507b of the first comparator 517 via NAND gate 514. The other input terminal of NAND gate 514 is supplied with an "H" logic level from a DC bias source 515. A switch 516 is provided so that this "H" logic level input can selectively be converted to an "L" logic level.

Figures 6A, 6B, 7:
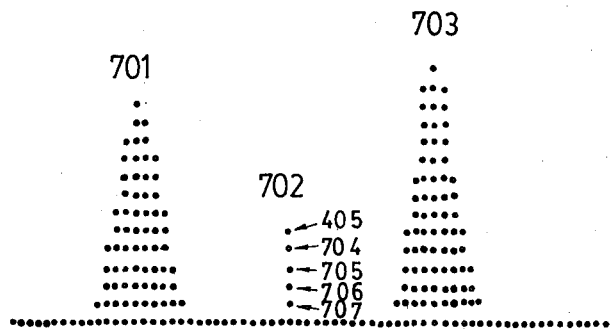
FIGS. 6A and B show waveforms for illustrating the operation of the waveform display apparatus of the embodiment of the present invention illustrated in FIG. 5.
FIG. 7 is a waveform diagram showing an example of a display provided by the embodiment of the waveform display apparatus of the present invention illustrated in FIG. 5.

With the above arrangement, when switch 516 is closed, the output of NAND gate 514 is an "H" logic level. Accordingly, upon each detection of coincidence between the data A and the counter content B of counter 508 by the first comparator 507, a video signal of logic level "L", for example, is outputted from NOR gate 513. In other words, after each decrement of down counter 508, all data, as shown in FIG. 6B, is read out of data memory 504 into comparator 507. Therefore, all the data is compared for each horizontal scanning line, and the video signal is produced at the point where the horizontal scanning line number and the data are equal. When switch 516 is closed, dots are displayed at the points where the data from data memory 504 and the horizontal scanning line numbers are equal, thus providing a display of an analog waveform as shown in FIG. 6A.

As discussed, when the analog waveform has a sharp characteristic, a display such as shown in FIG. 4B results. In this display, dot 405 indicating the peak point is likely to escape the observer's notice. This problem can be avoided by opening switch 516. With the switch open, the output of NAND gate 514 provides video signals of logic level "L" in the region of A>B. Consequently, when switch 516 is open, dots are added to the area underlying the dots representing A=B. Thus, the waveforms of FIG. 4A are respectively displayed as indicated in FIG. 7, and the contours of the waveforms 401, 402 and 403 can be discerned more easily. Also in the case of waveform 402, which rises and falls sharply with a very short duration, dots 704, 705, 706 and 707 are displayed under dot 405 representing the peak of waveform 402, to ensure that dot 405 is not overlooked. The scanning line number generating means 508, may also be an up-counter. When using an up-counter, the data stored in data memory 504 is provided as digital values ranging from zero to the uppermost scanning line of the frame. To display dots in the area underlying a waveform, a logic "H" output is produced from first comparator 507 when A<B.

Figure 8:
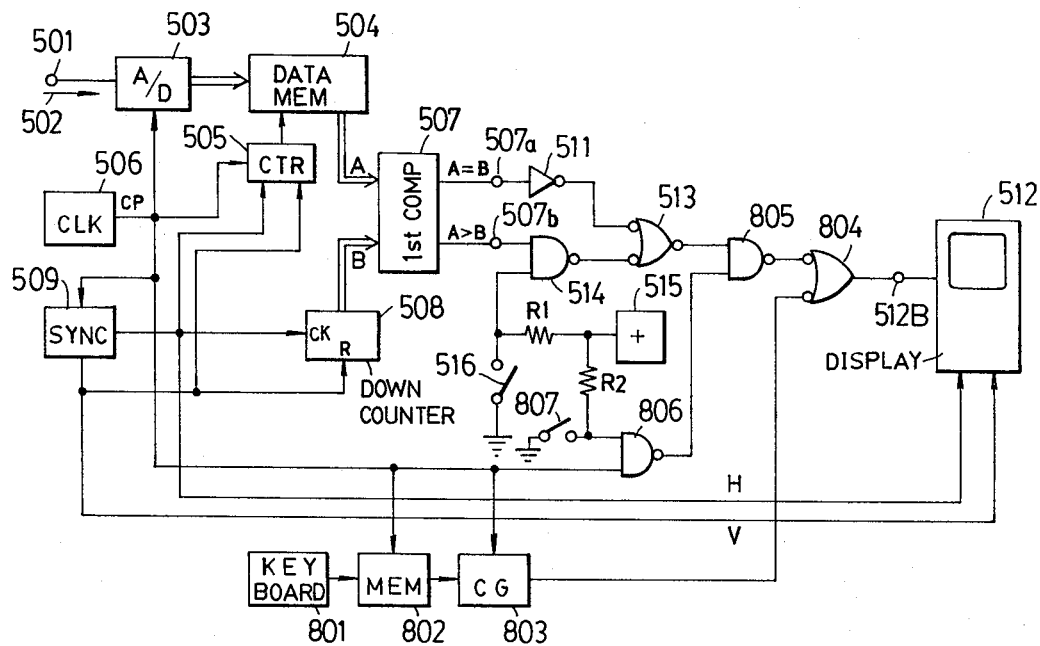
FIG. 8 is a block diagram illustrating a second embodiment of the present invention.

With the present invention it is also possible to display a character along with a waveform. FIG. 8 illustrates a circuit for implementing the character display in conjunction with the invention as illustrated in FIG. 5. In FIG. 8, keyboard 801, memory 802 and character generator 803 are added to the arrangement of FIG. 5, and elements shown in FIG. 8 that are also shown in FIG. 5, have the same reference numbers. A character signal to be displayed and a position signal indicating the position where the character is to be displayed are inputted into memory 802 from keyboard 801. The character signal read out of memory 802 is converted by character generator 803 into a video signal corresponding to horizontal and vertical scanning in a known manner and the video signal is output at the timing specified by the position signal. The video signal thus obtained from character generator 803 is provided to display unit 512 via NOR gate 804 which serves as a signal combining means. Thus, displays of waveform data and a character on the display unit 512 are produced. The displayed character can be temporarily erased by a command from keyboard 801 instructing character generator 803 to disable its output.

When switch 516 is opened, and waveform data such as shown in FIG. 6A is being displayed, dots in the area defined by the waveform are all displayed as bright spots. In this case, even if a character is displayed in such an area, it is almost illegible.

Figure 9:
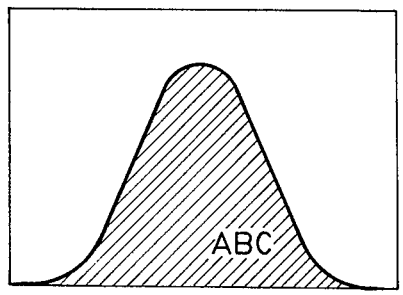
FIG. 9 is a waveform diagram showing an example of a display provided by the embodiment of FIG. 8.

The present invention overcomes this problem by providing NAND gate 805 in the path of the video signal. The NAND gate 805 is controlled by high speed clock pulses that gate or block the video signal. In other words, NAND gate 805 is provided between NOR gate 513 and the signal combining circuit NOR gate 804. The video signal from NOR gate 513 is applied to one input terminal of NAND gate 805 and clock pulses from pulse source 506 are applied to the other input terminal via NAND gate 806. By opening switch 807, a logic level "H" from the DC bias source 515 is provided to NAND gate 806 allowing clock pulses to pass to NAND gate 805, thereby gating the video signal output from NOR gate 513. When switch 807 is open, the video signal is gated by the clock pulses thereby reducing its mean time, and reducing the brightness or intensity of the video signal. As a result of this, a difference can be introduced in brightness between the video signal and the other signal, i.e. the character signal. Characters, for example, "ABC", displayed in the area of the waveform displayed by bright spots as shown in FIG. 9, are made legible. In the embodiment of FIG. 8, NAND gate 805 is inserted between the first signal combining circuit 513 and the second signal combining circuit 804, resulting in the video signal being chopped by the clock pulses. It is also possible to chop the character signal by the clock pulses. Chopping the character signal provides contrast between the waveform, its bright-spot area and the character so that the character displayed in the bright-spot area can be easily read.

Figures 10, 12:
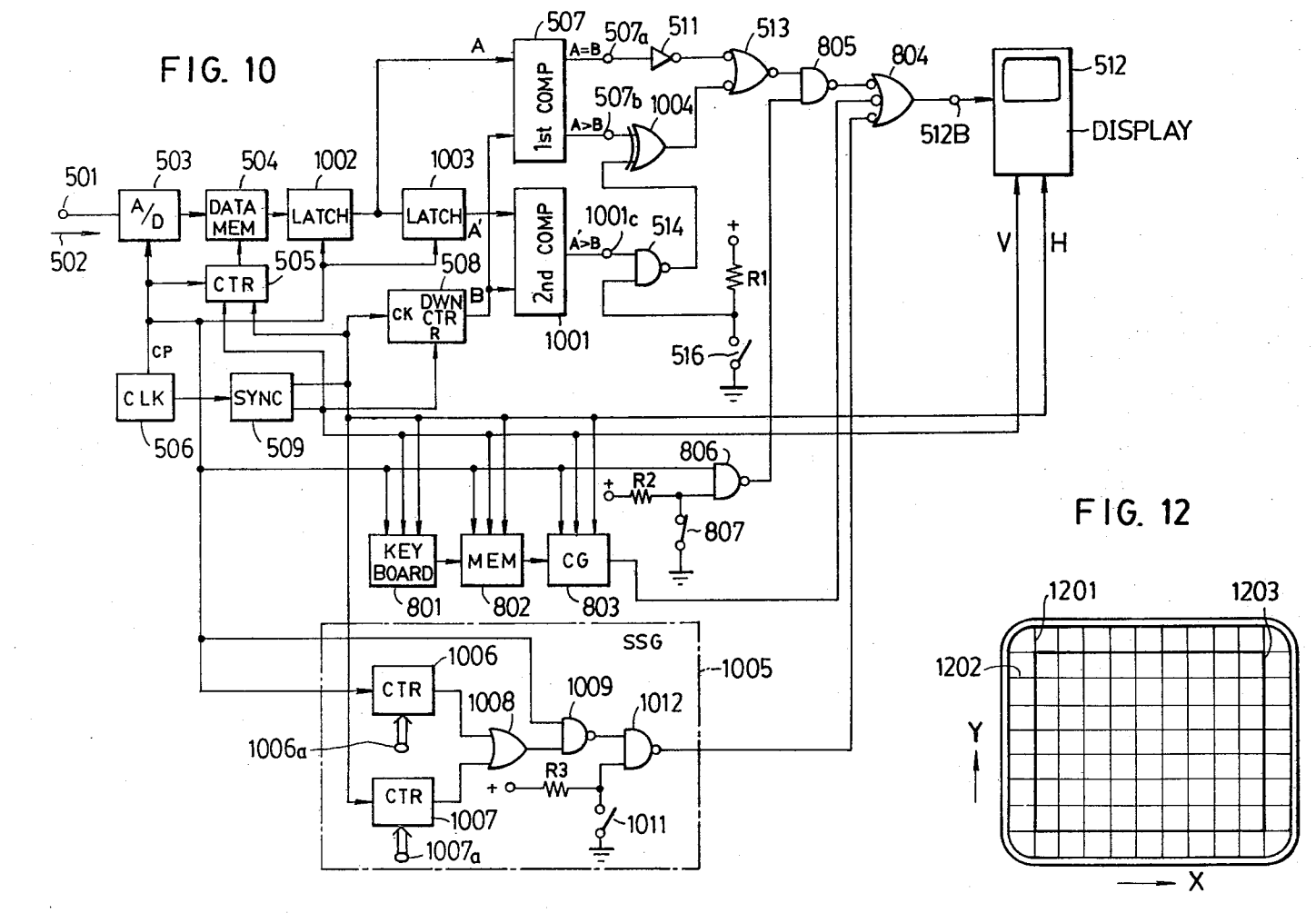

In the above embodiment the entire area defined by the waveform is displayed by bright spots to allow ease in observing the waveform. In practice the display can be made easier to see by interpolating the dots forming the waveform so that its contour is continuous. FIG. 10 illustrates, by way of example, an arrangement for providing such a display. Elements in FIG. 10 that are also illustrated in FIGS. 5 or 8 have the same reference numbers. In this embodiment, a second comparator 1001 is provided in addition to the first comparator 507. The second comparator 1001 makes a comparison between data A' read out of data memory 504 from an address immediately preceding the address of the data currently being compared with the horizontal scanning line number B in the first comparator 507. Comparator 1001 yields a logic level "H" output when A'>B.

To supply the second comparator 1001 with the data read out of the address immediately preceding the address of the data currently being accessed, two latch circuits 1002 and 1003 are provided. The waveform data read out of data memory 504 is clocked into the first latch circuit 1002 and then the output of the latch circuit 1002 is clocked into the second latch circuit 1003 at the next clock pulse. In this way, the latched content A of the first latch circuit 1002 is applied to the first comparator 507 and the latched content A' of the second latch circuit 1003 is applied to the second comparator 1001.

Figure 11:
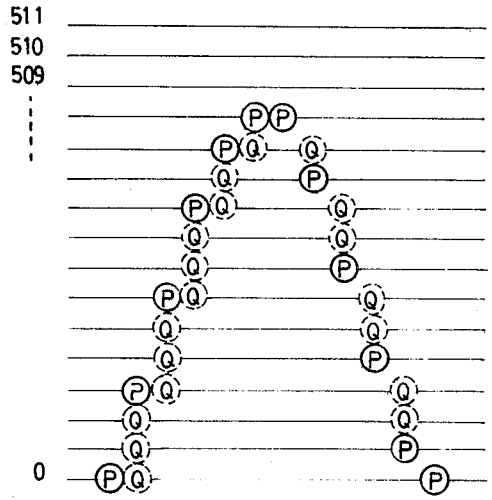
FIG. 11 is a waveform diagram showing an example of a display produced by the embodiment of FIG. 10.

By opening switch 516, NAND gate 514 blocks the output of the second comparator 1001. The output provided at output terminal 1001c of the second comparator 1001 is applied to a third comparator 1004 formed by a non-coincidence detector such as an exclusive OR circuit. This detector senses non-coincidence between the signals at the output terminal 507b of the first comparator 507 and the output terminal 1001c of the second comparator 1001. The non-coincidence detected output is applied to the signal combining circuit, NOR gate 513 and the output therefrom is provided to display unit 512 via NAND gate 805 and NOR gate 804 serving as the signal combining circuits. By this, the waveform data A, read out of data memory 504 is displayed on display unit 512 by bright spots P based on the video signals produced when A=B and by broken-line bright spots Q, as depicted in FIG. 11. The bright spots Q are based on the non-coincidence between the output A'>B obtained by comparing the data A', read out of data memory 504 at the address immediately preceding the current address with the scanning line number B, and the output A>B obtained by comparing the data A read out from the current address with the scanning line number B. By displaying the additional bright spots Q, the bright spots P corresponding to the data A are continuously interpolated to clearly display the contour of the waveform.

Also, by closing switch 516, NAND gate 514 blocks the output at the second comparator. This results in the video signal for A=B and the video signal for A>B both being supplied to display unit 512. Therefore, the waveform can be displayed by bright spots over the entire area under the bright spots P. Since the primary object of the embodiment of FIG. 10 is to interpolate dots between the waveform video signals, it is also possible to omit switch 516 and gate 514 and to connect the output of the second comparator 1001 to the third comparator 1004 via an inverter (not shown).

Further, the embodiment of FIG. 10 is arranged so that a scale may be displayed by an electric signal on the display surface of display unit 512. The scale signal generator is indicated by a broken-line block 1005. The scale signal generator 1005 comprises a pair of counters 1006 and 1007, implemented by presettable counters whose preset value can be selected by setting appropriate numerical values at their terminals 1006a and 1007a, respectively. Clock pulses of a frequency which divides the horizontal scanning period of display unit 512 into 1000 equal time periods are applied to counter 1006. Counter 1007 is supplied with a horizontal synchronizing signal to be provided to display unit 512. By providing a preset value to terminal 1006a of counter 1006, counter 1006 operates as a 100-step counter, and by providing a preset value to terminal 1007a of counter 1007, counter 1007, for example, operates as a 64-step counter. Counter 1006 yields a carry signal at each count of 100 clock pulses during the horizontal scanning of display unit 512 and counter 1007 produces an output at each count of 64 horizontal scanning lines. These outputs are combined by OR gate 1008, to form a composite signal. The composite signal is fed to NAND gate 1009 which is gated by the clock pulses. The gated signal is then applied to display unit 512 via NAND gate 1012 which is controlled by switch 1011. This arrangement, as depicted in FIG. 12, displays on the display surface of display unit 512 ten graduation lines, 1201, in the X-axis direction and eight graduation lines, 1202, in the Y-axis directon. By opening switch 1011, graduation lines 1201 and 1202 can be displayed on the display surface of display unit 512 and they can be erased by closing switch 1011. By selecting the preset values of counters 1006 and 1007, spacings of graduation lines 1201 and 1202 can be varied. An arrangement can be made so that the preset values are set into counters 1006 and 1007 by keyboard 801. It is also possible to display graduation lines 1201 and 1202 within frame 1203 indicated by the thick lines in FIG. 12. This is done by providing gate signal to NAND gate 1009. The graduation line generating means 1005 is equally applicable to the embodiments of FIGS. 5 and 8.

The following describes in detail an input circuit for writing digitized analog waveform into data memory 504.

Figure 13:
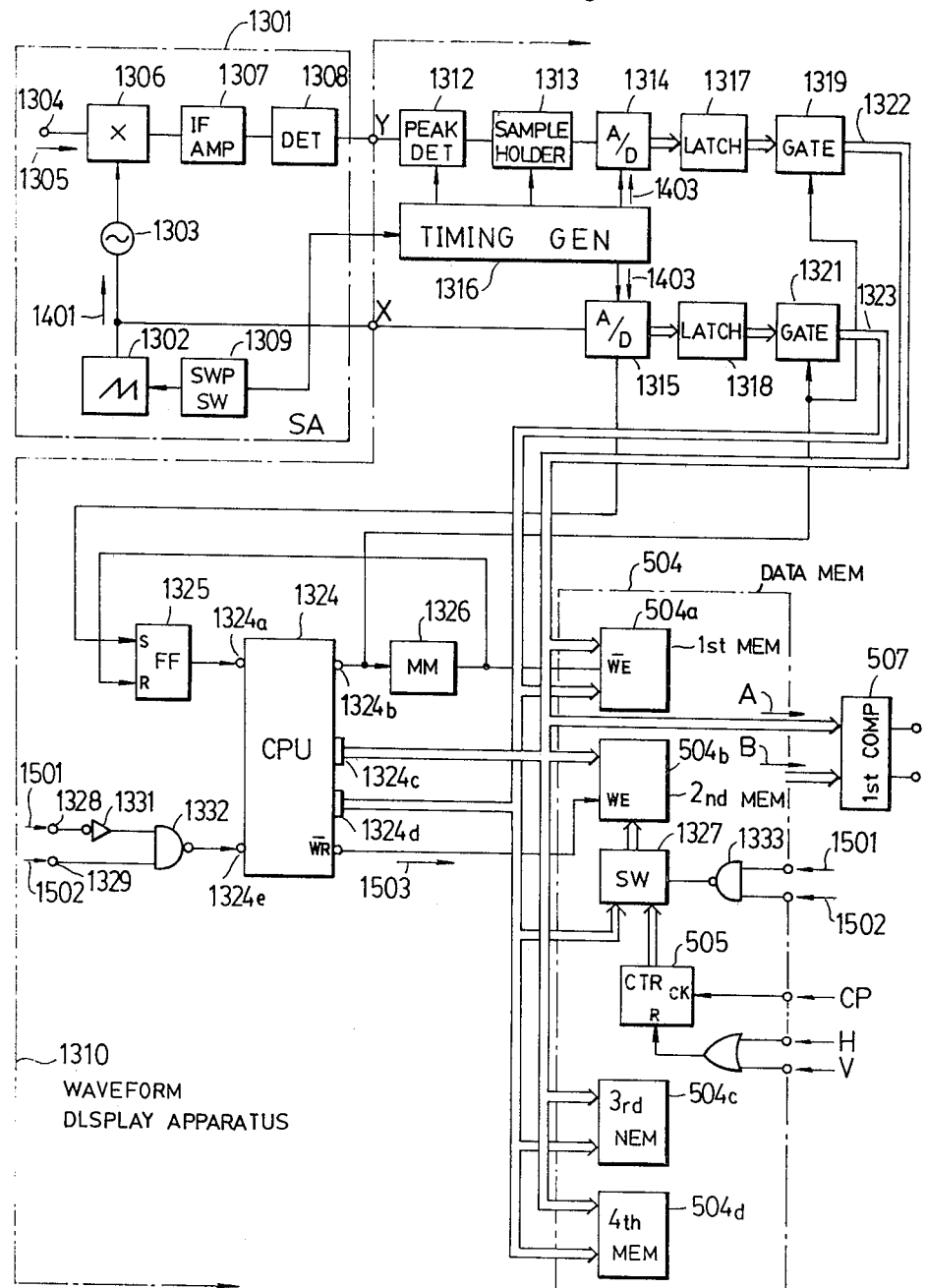
FIG. 13 is a block diagram illustrating a specific arrangement of an input circuit of the waveform display apparatus of the present invention.

FIG. 13 illustrates a specific example of an input circuit, in which a spectrum signal from a spectrum analyzer is written into data memory 504. As is well-known in the art, the spectrum analyzer, indicated by 1301, comprises a ramp voltage generator 1302, a frequency sweep type local oscillator 1303, the oscillation frequency of which is swept by a ramp voltage signal 1401 (FIG. 14A) from the ramp voltage generator 1302, a frequency mixer 1306 for frequency-mixing a frequency swept signal from the local oscillator 1303 and an input signal 1305 from an input terminal 1304 to provide an intermediate-frequency signal of a fixed frequency, an intermediate-frequency amplifier 1307 for amplifying the intermediate-frequency signal, a detector 1308 for detecting the output from the intermediate-frequency amplifier 1307 to yield an analog waveform signal 1402 (FIG. 14B) to be displayed on display unit 512, and a sweep frequency change-over switch 1309 for switching the frequency of the ramp voltage signal 1401 available from the ramp voltage generator 1302.

Figure 14:
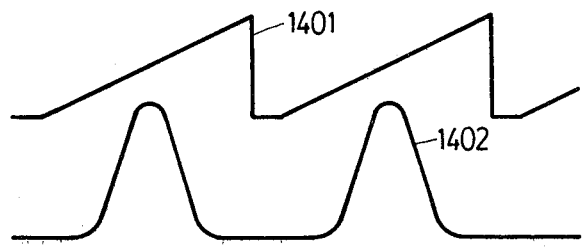
FIGS. 14A, 14B and 14C and FIGS. 15A, 15B, and 15C are waveform diagrams illustrating the operation of the input circuit depicted in FIG. 13.
Figure 14:
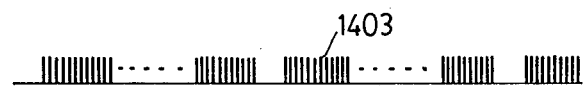

Ramp voltage generator 1302 and detector 1308 produce ramp voltage signal 1401 and the analog signal 1402 synchronized therewith, as shown in FIGS. 14A and 14B, respectively. The ramp voltage signal 1401 and the analog signal 1402 are respectively applied to input terminals Y and X of a waveform display apparatus 1310 of the present invention and digitized by A-D converters 1314 and 1315. The timing of the A-D conversion is defined by clock pulses which are produced from the sweep frequency change-over switch 1309 of the spectrum analyzer 1301. That is, the clock pulses from the sweep frequency change-over switch 1309 are applied to timing signal generator 1316 which generates an operation timing signal 1403 for each of the A-D converters 1314 and 1315. Accordingly, timing signal 1403 varies in accordance with switching of the frequency-sweep frequency of the spectrum analyzer 1301. That is, the frequency of the ramp voltage signal 1401 is arranged such that even if the frequency of the ramp voltage signal 1401 is changed, its one period is divided by a fixed number of dots. The operation timing of A-D converters 1314 and 1315 is selected such that one period of the ramp voltage signal 1401 is divided into at least 1000 equal time periods. This value is selected because in this example, data memory 504 has 1000 addresses.

The A-D converter 1314 is preceded by peak value detector 1312 and a sample and hold circuit 1313 in the present invention. Peak value detector 1312 detects a peak value in a sampling period, the sample and hold circuit 1313 stores the peak value and applies it to A-D converter 1314. Accordingly, the A-D converted output from the A-D converter 1314 is an A-D converted value of the peak value of the analog signal 1402 during each sampling period. This ensures that the peak of a spectrum in the sampling period will be detected even if it sharply rises and falls and has a very short duration.

Timing signal 1403 simultaneously activates A-D converter 1315 and A-D converter 1314. The A-D converter 1315 converts, at the time of the timing signal 1403, the voltage value of the ramp voltage signal 1401 applied to the input terminal X into digital form, yielding an address signal for data memory 504. The converted outputs from the A-D converters 1314 and 1315 are temporarily latched in latch circuits 1317 and 1318, respectively, and the latch outputs are respectively applied via gates 1319 and 1321 to data bus line 1322 and to address bus line 1323. Gating of the latch outputs to bus lines 1322 and 1323 and the generation of a write command to data memory 504 are controlled by central processor unit 1324.

In this example, data memory 504 is shown to have incorporated therein first to fourth memories 504a, 504b, 504c and 504d. Memory 504a serves as a memory for inputting data, the second memory 504b, as a memory for display, the third memory 504c, as a memory for temporarily storing the waveform data, and the fourth memory 504d as a memory for storing a corrective value used when conducting corrective calculation with the analog data. A plurality of memories such as 504d may sometimes be provided.

The waveform data, is usually inputted into data input memory 504a, and then transferred to memory 504b to be displayed. For each main scanning of display unit 512, the data is read out of all addresses of 504b by address signals from the address counter 505 at a rate 1000 times higher than the main scanning and supplied to the first comparator 507.

The operations to write the waveform data into data input memory 504a, are described below with reference to FIGS. 13 and 17A. Upon completion of each A-D conversion by A-D converter 1315, flip-flop 1325 is set and applies an interrupt signal called a bus request signal to terminal 1324a of CPU 1324. The bus request signal causes, as shown in step $S_1$ of FIG. 17A, the data bus terminal 1324c and address bus terminal 1324d of CPU 1324 to be put in a floating state, electrically disconnecting CPU 1324 from bus lines 1322 and 1323. Simultaneously, as shown in step $S_2$ of FIG. 17A, a bus acknowledge signal is generated at terminal 1324b of CPU 1324. The bus acknowledge signal is applied to gates 1319 and 1321 enabling them, step $S_3$ of FIG. 17A, and thus allowing the output terminals of latch circuits 1317 and 1318 to be electrically connected to data bus line 1322 and address bus line 1323, respectively. As a result, the A-D converted value of a first dot latched in latch circuit 1317 appears on data bus line 1322 and is supplied to the data input terminal of data input memory 504a, step $S_4$ of FIG. 17A. The A-D converted value of a first dot of ramp voltage signal 1401 latched in latch circuit 1318 appears on address bus line 1323 and is applied to the address input terminal of data input memory 504a. At the same time, monostable multivibrator 1326 is triggered by the bus acknowledge signal derived from terminal 1324b of CPU 1324 thus applying a write command signal of logic level "L" to the read/write terminal of memory 504a, step $S_5$ of FIG. 17A. This write command signal causes the A-D converted value of the analog waveform to be written into an address of data input memory 104a. The trailing edge of the write command signal from monostable multivibrator 1326 resets flip-flop 1325, step $S_6$ of FIG. 17A, and returns CPU 1324 to its preinterrupt state, thus connecting data terminal 1324c and address terminal 1324d of CPU 1324 to data bus line 1322 and address bus line 1323, respectively. Accordingly, gates 1319 and 1321 are disabled, thus disconnecting latch circuits 1317 and 1318 from bus lines 1322 and 1323. Then, CPU 1324 begins executing a data transfer program described below with reference to FIGS. 13 and 17B. Upon A-D conversion of the next sampling point, flip-flop 1325 is again set, providing a bus request signal to CPU 1324, by which the A-D converted value of a second dot latched in latch circuits 1317 and 1318 is written into memory 504a. This operation is repeatedly executed during each period of the ramp voltage, 1401, during which time, the A-D converted values of the waveform applied to the input terminal Y are stored in memory 504a in an area corresponding to one frame. The write operation is executed for each period of ramp voltage 1401. Therefore, when the waveform applied to the input terminal Y varies, the content of memory 504a is immediately rewritten and reflects the new analog waveform.

The transfer of data from data input memory 504a to memory 504b for display use is executed in accordance with the steps shown in FIG. 17B and described below. Upon completion of writing data into memory 504a, flip-flop 1325 is reset to release CPU 1324 from its interrupted state, returning it to its preinterrupt state. While not interrupted, CPU 1324 continuously executes the data transfer program transferring from data input memory 504a to memory 504b for display use. This transfer program includes a program sequence for reading out a data value stored in a predetermined address of data input memory 504a, step $S_8$, a program sequence for changing a chip select signal to chip-select from data input memory 504a to memory 504b, step $S_{10}$, a program sequence for writing the data read out of memory 504a into memory 504b at the same address as that of memory 504a from which the data was read, step $S_{12}$, and a program sequence to increment the address by one upon completion of writing the data into memory 504b, step $S_{14}$.

Before executing the steps 8, 10, 12 and 14 of the data transfer program, a check for an active bus request signal, BUSRQ, is made at steps 7, 9, 11 and 13. If the BUSRQ signal is active, then the subroutine illustrated in FIG. 17A is executed, after which program execution returns to the data transfer program.

Upon completion of writing the data into memory 504b, data input memory 504a is accessed at the next address and data at that address is read out and transferred to memory 504b.

During the horizontal scanning period of display unit 512, memory 504b is accessed by address signals available from address counter 505. Each of the 1000 addresses of memory 504b are read out during one horizontal scanning period. This is executed for each horizontal scanning. Accordingly, the data is written into memory 504b for each blanking period of the horizontal scanning of display unit 512. When writing the data into memory 504b, address counter 505 is disconnected from the address terminal of memory 504b and address bus 1323 is connected to the address terminal of memory 504b by switch 1327.

Figure 15:
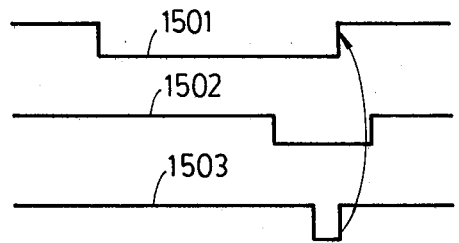

Upon completion of writing data into memory 504a, CPU 1324 is returned to its state of executing the transfer program. The transfer program executes the sequence of operations to read data from a certain address of memory 504a and the sequence of operations to transfer the data into memory 504b, as discussed. Assuming for this example, that CPU 1324 yields a 12-bit address signal, and memories 504a to 504d are accessed by an address signal composed of the low-order 10 bits of the 12-bit address signal, then two high-order bits of the 12-bit address signal are employed as a select signal to select memories 504a and 504d. When CPU 1324 inputs the data stored in a certain address of data input memory 504a, the status of the high-order two bits of the address signal is changed over to select memory 504b. Thus, memory 504b is accessed at the same address as the read-out address of data input memory 504. The most significant bit of the 12-bit address signal, signal 1501, is used in generating the chip select for memory 504b (See FIG. 15A). Signal 1501 and the horizontal synchronizing signal (see FIG. 15B) are applied to terminals 1328 and 1329, respectively. Signal 1501 is provided via inverter 1331 to one input of NAND gate 1332. The horizontal synchronizing signal 1502 is applied directly to the other input terminal of NAND gate 1332. When the signal 1501 is a logic level "L", memory 504b is selected. In this case, if the horizontal synchronizing signal 1502 is logic level "H", that is, if display unit 512 is in its horizontal scanning period, then CPU 1324 is put in its WAIT state, stopping its operation while memory 504b is selected. When the horizontal synchronizing signal 1502 falls to a logic level "L", starting the horizontal blanking period, CPU 1324 provides write signal 1503 to memory 504b. Further, signal 1501 and the horizontal synchronizing signal 1502 are respectively applied to the two input terminals of NAND gate 1333 which controls switch 1327.

When both signals are at the logic level "L", switch 1327 gates address bus 1323 to memory 504b. Consequently, memory 504b is accessed by the address signal from CPU 1324 and the data input from memory 504a is written into the accessed address position of memory 504b. Upon completion of the write operation, CPU 1324 increments its address counter by one to input data from the next address of memory 504a. After completing this input, the most significant bit of the address signal is changed to select memory 504b, and to put CPU 1324 in the WAIT state. In this state, when the horizontal synchronizing signal 1502 assumes logic level "L" to start the horizontal blanking period, write signal 1503 is applied to memory 504b to write the data of the next address into memory 504b. In this way, the address is incremented one by one and when the last address is reached, it is followed by the first address. The operation is then repeated. This transfer operation is continuously executed except when executing, by interrupt, the operation of inputting data into data input memory 504a after the A-D conversion by A-D converters 1314 and 1315. The maximum data transfer rate from memory 504a to memory 504b is the horizontal scanning frequency of the display unit 512. Accordingly, the A-D conversion frequencies of A-D converters 1314 and 1315 cannot be set higher than the horizontal scanning frequency. Due to this limitation, the frequency of 1000 times higher than that of the ramp voltage signal 1401 must be lower than the horizontal scanning frequency. For example, when the horizontal scanning frequency of the display unit 512 is 15,750 Hz as in the standard system, the frequency of the ramp voltage signal 1401 is selected to be less than or equal to 15.75 Hz.

The program structure allows CPU 1324 to respond to interrupt commands from a keyboard. Thus providing, in addition to the data inputting operation and the data transfer operation described above, an operation of transferring data from memory 504b to memory 504c for temporary storage of the waveform data being displayed, and a corrective operation of adding corrective data stored in memory 504d to the data being displayed.

Although in the foregoing data is first input into waveform data input memory 504a and then transferred to memory 504b via CPU 1324, memory 504a may be omitted. When memory 504a is omitted, the waveform data latched in the latch circuit 1319 is written directly into memory 504b at the address indicated by the address signal latched in latch circuit 1321. This writing operation is executed during the blanking period of the horizontal scanning of the raster scanning type display 512. However, omitting data input memory 504a gives rise to the disadvantage that the corrective operation cannot be executed.

Figures 14, 15, 16:
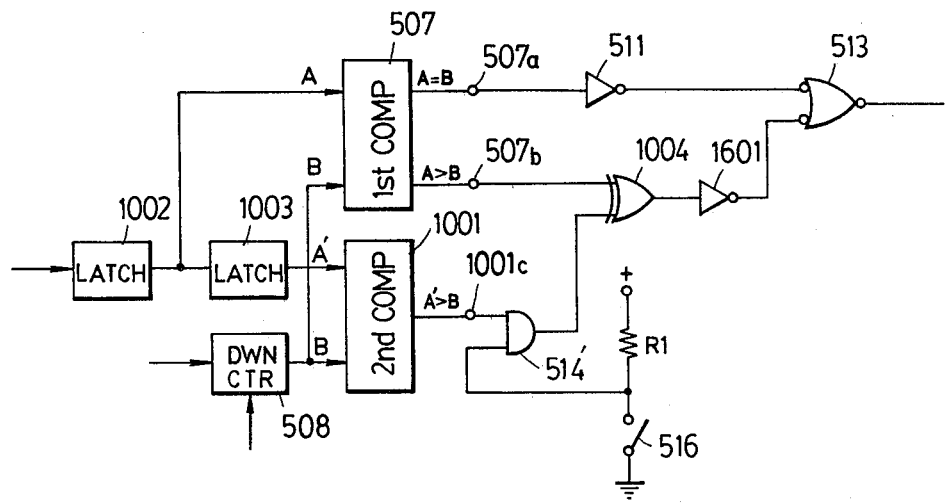
FIG. 16 is a block diagram illustrating a fourth embodiment of the present invention.

Another embodiment of the present invention utilizes a coincidence detector instead of the non-coincidence detector of the embodiment illustrated in FIG. 10. FIG. 16 shows an example of the circuit employing a coincidence detector. In this example, the coincidence detector is composed of exclusive OR circuit 1004 and inverter 1601. The output terminal 507b of the first comparator 507 is a logic level "H" when A>B, and the output terminal 1001c of the second comparator 1001 is a logic level "H" when A'>B, and is applied via AND gate 514 to the exclusive OR circuit 1004. By providing such compared outputs to the input terminals of the third comparator 1004, an interpolated waveform similar to that depicted in FIG. 11 can be displayed on display unit 512.

As described above, in the present invention the analog waveform data is subjected to A-D conversion. The resulting numerical values correspond to the sampled points' position in the vertical direction and to the number of the horizontal scanning line. For example, when the number of horizontal scanning lines is 512, the position's numerical value resulting from A-D conversion can be defined by a nine-bit code. Accordingly, even if each horizontal scanning line is formed by 1000 dots, waveform data of one frame can be stored by a memory having a 9K-bit capacity as a whole. In contrast, for a storage with a 1000-dot resolution in the horizontal direction using a shift register as in the prior art, the shift register must have a capacity of 1,000×512 bits. Therefore, according to the present invention, the capacity of the waveform data memory 504 can be substantially reduced as compared with the storage capacity required in the past for storing the waveform data to obtain the same resolution.

In addition, since the entire area defined by the waveform data can be displayed by bright spots by opening switch 516, it is possible to eliminate the possibility of overlooking the peak points of steep waveforms such as shown in FIG. 4.

Moreover, the present invention provides means for decreasing the brightness of each of the bright spots within the area defined by the waveform. By activating this means, when displaying a character in the bright spot area, the waveform and the character can be displayed at different brightnesses so that they are readily distinguishable. This permits displaying a character at any place on the display surface and hence is very convenient in practical use.

In the case where adjacent bright spots displaying the contour of a waveform are greatly spaced apart in the vertical direction, a non-coincidence output comparing the A'>B and A>B outputs is displayed as a video signal in addition to that based on the compared output A=B. In the resulting display, the bright spots generated by the compared outputs A=B are interpolated to display the waveform by a continuous line. This provides an easily observable waveform.

In the present invention, the peak value detector 1312, FIG. 13, is positioned before the conversion of the analog waveform into digital form. This ensures that even when waveforms, such as indicated by 401, 402 and 403 in FIG. 4A, are input, their peak values can always be sampled and converted into digital form. Accordingly, the peak value of any waveform can be accurately displayed no matter how short the duration of the waveform.

Further, in the present invention, a scale can be displayed on the display surface of display unit 512, as desired, by the scale display signal generator 1005. This facilitates easy reading of the peak value of the waveform being displayed.

It is also possible to store analog waveform data in memory 504b and, simultaneously, to temporarily store the currently displayed waveform in the temporary memory, 504c, under the control of CPU 1324. Accordingly, if, for example, data of a transient phenomenon which occurs only once is loaded into the temporary memory 504c, the transient phenomenon can be repeatedly displayed as desired. Moreover, since memory 405d is provided for storing a corrective value, for instance, the frequency characteristic of a spectrum can be easily corrected.

In the present invention, since a raster scanning type display unit is employed as display unit 512, for example, an electromagnetic deflection type cathode ray tube can be used. The electromagnetic deflection type cathode ray tube has a small tube axis length compared with an electrostatic deflection type cathode ray tube. Accordingly, the present invention provides a large display area, but the display apparatus is small in comparison with the conventional display apparatus employing the electrostatic deflection type cathode ray tube. Further, the use of the raster scanning type display unit provides the advantage that a character can easily be displayed along with an analog waveform by applying a character signal to a character generator.

Although the foregoing embodiments have been described in connection with the case where the compared outputs A=B and A>B are detected by the first comparator 507 and the entire area underlying a waveform is displayed by bright spots, it is also possible to display the entire area above the waveform by bright spots.

It will be apparent that many modifications and variations may be effected without departing from the scope of the novel concepts of the present invention.

What is claimed is:

1. A waveform display apparatus comprising:
a raster scan-type display unit having a horizontal input, a vertical input, a video signal input, a display surface having a specified number of main scanning lines, each of said main scanning lines having a specified number of picture elements, said display surface being raster scanned in accordance with said video signal input, each of said picture elements being optically displayed on the scanned display surface;
a data memory for storing digital data to be displayed, said data memory having a specified number of addresses corresponding to a specified number of storage locations, said specified number of addresses being the same as said specified number of picture elements of one of said main scanning lines, each of said specified number of storage locations having a storage capacity corresponding to said specified number of main scanning lines of said display surface of said raster scan-type display unit, said data memory including
a data input memory, operatively connected to receive said data to be displayed and having a specified storage capacity, for storing said data to be displayed;
a display memory, operatively connected to said data input memory and to said first comparator and having a specified storage capacity, for receiving the data stored in said input data memory;
transferring means, operatively connected to said data input memory and to said display memory, for transferring the contents of said data input memory to said display memory, wherein said specified storage capacity of said data input memory and said specified storage capacity of said display memory are equal;
read out means, operatively connected to said data memory, for repeatedly reading said data memory in synchronism with the scanning of said main scanning lines of said raster scan-type display unit;
scanning line number generating means, operatively connected to said read out means, for generating the number of the main scanning line in synchronism with the scanning of said raster scan-type display unit and for providing, as an output, the scanning line number corresponding to the number of the main scanning line being scanned;
a first comparator having first and second data inputs operatively connected to said data memory and to said output of said scanning line number generating means, respectively, having a first data output active when said first and second data inputs coincide, and having a second data output active when said first and second data inputs of said first comparator are in a state of non-coincidence;
delay means, having first and second inputs operatively connected to said data memory and to said read out means, respectively, for delaying the data read out of said data memory for a predetermined time corresponding to the time between two successive read outs of said data memory by said read out means;
a second comparator, having first and second data inputs operatively connected to said delay means and to said output of said scanning line number generating means, respectively, and having an output, for comparing said output of said delay means with said output of said scanning line number generating means, said output of said second comparator being active when said first data input of said second comparator is larger than said second data input of said second comparator;
first gate means, having a first input operatively connected to said output of said second comparator and having an output, for gating said output of said second comparator;
a third comparator having first and second inputs operatively connected to said second output of said first comparator and said output of said first gate means, respectively, for comparing said second output of said first comparator with said output of said first gate means and for providing an active output when said first and second inputs of said third comparator are in a predetermined state; and
first operating means, operatively connected to said first gate means and having first and second operating states, for controlling said gate means, said output of said second comparator disconnected from or operatively connected to said second input of said third comparator in dependence upon said first and second operating states, respectively;
first signal combining means, having a plurality of inputs operatively connected to said first output of said first comparator and to said output of said third comparator, respectively, and having a output with a mean period, operatively connected to said video signal input of said raster scan-type display unit, for combining said first output of said first comparator and said output of said third comparator.

2. A waveform display apparatus according to claim 1, wherein said third comparator comprises an exclusive OR gate having first and second inputs operatively connected to said second output of said first comparator and said output of said first gate means, respectively, and having an output operatively connected to at least one of said plurality of inputs of said first signal combining means.

3. A waveform display apparatus according to claim 1, wherein said predetermined state of said first and second inputs of said third comparator is a state of non-coincidence.

4. A waveform display apparatus according to claim 1, wherein said predetermined state of said first and second inputs of said third comparator is a state of coincidence.

5. A waveform display apparatus according to claim 1, having means for receiving character signals, wherein said read out means generates a clock signal, a horizontal sync signal, and a vertical sync signal, said waveform display apparatus further comprising:
 a character memory, having an output and having a plurality of inputs operatively connected to said read out means, for storing said character signals, wherein said character signals are read out of said character memory in accordance with said clock signal, said horizontal sync signal, and said vertical sync signal;
 a character generator, having an output and having a first input operatively connected to said character memory, having a second input for receiving said character signals operatively connected to said read out means, said character generator converts said character signals into a video signal in synchronism with said clock signal, said horizontal sync signal, and said vertical sync signal; and
 second signal combining means, having a first input operatively connected to said output of said character generator, having a second input operatively connected to said output of said first signal combining means, and having an output operatively connected to said video signal input of said raster scan-type display unit, for combining said output of said character generator and said output of said first signal combining means.

6. A waveform display apparatus according to claim 5, further comprising a keyboard for generating said character signal.

7. A waveform display apparatus according to claim 5, further comprising:
 second gate means, having a first input operatively connected to receive said clock signal and having an output, for gating said clock signal;
 third gate means, operatively connected between said first signal combining means and said second signal combining means, having a plurality of inputs operatively connected to said output of said first gate means and to said output of said first signal combining means, respectively, and having an output operatively connected to said second input of said second signal combining means, for gating said output of said first signal combining means; and
 second operating means, operatively connected to a second input of said second gate means and having first and second states, for controlling said second gate means, wherein said clock signal is disconnected from or operatively connected to said output of said second gate means in dependence upon said first and said second states of said operating means, respectively, so that when said second operating means is in said first state, said output of said third gate means reduces said mean period of said output of said first signal combining means and when said operating means is in said second state, said mean period of said output of said first signal combining means is not reduced.

8. A waveform display apparatus according to claim 7, wherein said second operating means comprises a manual switch having closed and open states corresponding to said first and second states of said second operating means, respectively.

9. A waveform display apparatus according to claim 1, wherein said apparatus is operatively connected to receive an analog signal and has a blanking period during the scanning of said main scanning lines of said raster scan-type display unit, said apparatus further comprising:
 first analog to digital conversion means, having a first input for receiving said analog signal and having an output, for converting said analog signal into said input digital date to be displayed;
 first latch means, having an input operatively connected to said output of said first analog to digital conversion means and having an output, for temporarily storing said input digital data to be displayed;
 address generating means, having an input, having a first output operatively connected to said data memory, and having a second output, for generating an address signal, said address signal generating means being updated each time said input digital data to be displayed is temporarily stored in said first latch means; and
 writing means, having a first output operatively connected to said data memory, having a second output operatively connected to said input of said address generating means, and having a first input operatively connected to said second output of said address generating means, for writing said temporarily stored input digital data to be displayed into said data memory during said blanking period, in accordance with said address signal outputted from said address signal generating means.

10. A waveform display apparatus according to claim 9, wherein said data memory further comprises a corrective memory, operatively connected to said data input memory, to said display memory and to said transferring means, for storing a corrective value, wherein said input digital data to be displayed is added to, subtracted from, multiplied by, or divided by said corrective value before being stored in said display memory.

11. A waveform display apparatus according to claim 9, operatively connected to receive a ramp signal, wherein said address generating means further comprises:
 second analog to digital conversion means, having a first input operatively connected to receive said ramp signal and having a plurality of outputs, for converting said ramp signal into said address signal;
 synchronizing means, operatively connected to receive said analog signal and said ramp signal, for synchronizing said analog signal with said ramp signal.

12. A waveform display apparatus according to claim 11, wherein said synchronizing means includes means for synchronizing the operation of said first analog to digital conversion means with the operation of said second analog to digital conversion means, so that both operate at a maximum rate of 1000 times the frequency of said ramp signal.

13. A waveform display apparatus according to claim 12, wherein said frequency of said ramp signal is less than or equal to 15.75 Hz.

14. A waveform display apparatus according to claim 11, wherein said synchronizing means further comprises:
- frequency sweep oscillator means, having an input operatively connected to said ramp signal, for generating an output signal which varies in dependence upon said ramp signal;
- frequency mixer means, having a plurality of inputs operatively connected to receive said analog signal and operatively connected to said output of said frequency sweep oscillator means, respectively, for mixing said output of said frequency sweep oscillator means and said analog signal and for generating, as an output, an intermediate frequency signal; and
- detecting means, having an input operatively connected to said output of said frequency mixer means for detecting said output of said frequency mixer means and for providing an output which varies in accordance with said ramp signal to said first analog to digital conversion means.

15. A waveform display apparatus according to claim 11, further comprising a peak detector, having an input operatively connected to said synchronizing means and an output connected to said first analog to digital conversion means, for detecting the peak value of said analog signal in synchronism with said first analog to digital conversion means.

16. A waveform display apparatus according to claim 1, wherein said read out means generate a clock signal having a specified duty cycle, a horizontal sync signal and a vertical sync signal, said apparatus further comprising:
- scale signal generating means, having a plurality of inputs respectively, operatively connected to said read out means for receiving said clock signal and said horizontal sync signal, for generating a scale signal; and
- second signal combining means, having a first input operatively connected to said output of said first signal combining means, having a second input operatively connected to said output of said scale signal generating means, and having an output operatively connected to said video signal input of said raster scan-type display unit, for combining said output of said scale generating means with said output of said first signal combining means.

17. A waveform display apparatus according to claim 16, having means for receiving first and second scale information signals, wherein said scale signal generating means further comprises:
- first counting means, having a plurality of inputs operatively connected to receive said clock signal and said first scale information signal, respectively, for counting said clock signal and for providing a output which changes in response to said clock signal and said first scale information signal;
- second counting means, having a plurality of inputs operatively connected to receive said horizontal sync signal and said second scale information signal, respectively, for counting said horizontal signal and for providing an output which changes in response to said horizontal signal and said second scale information signal;
- third signal combining means, having a plurality of inputs operatively connected to said output of said first counting means and to said output of said second counting means, respectively, for combining said outputs of said first and second counting means and for providing an output having a mean period which varies in accordance with said outputs of said first and second counting means;
- third gate means, having a first input operatively connected to receive said clock signal, having a second input operatively connected to said output of said third signal combining means, and gaving an output operatively connected to said video signal input of said raster scan-type display unit, for gating said output of said third signal combining means and reducing said mean period, so that the output of said third gate means has video and non-video producing states, said mean period of said output of said third signal combining means being reduced in accordance with said specified duty cycle of said clock signal; and
- third operating means, having first and second states and operatively connected to said third gate means, for controlling said third gate means, said output of said third gate means varying in accordance with said clock signal and said output of said third signal combining means when said third operating means is in said second state, said output of said third gate means being in said non-video producing state when said third operating means is in said first state.

18. A waveform display apparatus according to claim 17, wherein said operating means comprises a manual switch having closed and open states corresponding to said first and second states, respectively.

19. A waveform display apparatus according to claim 1, having means for receiving a clock signal, wherein said read out means comprises:
- sync signal generating means, having an input operatively connected to receive said clock signal, for providing, as a first output, a horizontal sync signal, and, as a second output, a vertical sync signal, each of said vertical and horizontal sync signals having active and inactive states;
- counting means, having a plurality of inputs operatively connected to said sync signal generating means, and having an output operatively connected to said data memory, for counting said active states of said horizontal signal, wherein each of said active states of said vertical sync signal resets said counting means.

20. A waveform display apparatus according to claim 19, wherein said scanning-line number generating means comprises a counter having first and second inputs, operatively connected to said sync signal generating means, and having an output for outputting the generated scanning-line number, said counter counting said active status of said horizontal sync signal, and said counter being reset by said active states of said vertical sync signal.

21. A waveform display apparatus according to claim 1, operatively connected to receive an analog signal, wherein said read out means generates a clock signal, a horizontal sync signal, and a vertical sync signal, said apparatus further comprising:
- synchronizing means, operatively connected to receive the analog signal, for generating a ramp signal, and for mixing said ramp signal and the analog signal to provide, as an output, a synchronized analog signal;
- timing signal generating means, operatively connected to said synchronizing means, for generating, in accordance with said ramp signal, a detecting timing signal, a sample timing signal, and a conversion timing signal;

a peak detector, operatively connected to said synchronizing means and to said timing signal generating means, for receiving said synchronized analog signal and said detecting timing signal, said peak detector providing the peak value of said synchronized analog signal in synchronism with said detecting timing signal;

sample and hold means, operatively connected to said peak detector and to said timing signal generating means, for receiving said peak value and said sample timing signal, said sample and hold means providing a sampled analog signal in synchronism with said sample timing signal;

first analog to digital conversion means, operatively connected to said sample and hold means and to said timing signal generating means, for receiving said sample analog signal and said conversion timing signal, said first analog to digital conversion means converting said sampled analog signal, in synchronism with said conversion timing signal, into input digital data;

first latch means, operatively connected to said first analog to digital conversion means, for receiving said input digital data, said first latch means temporarily storing said input digital data;

address generating means, operatively connected to said synchronizing means and to said timing signal generating means, for receiving said ramp signal and said conversion timing signal, said address generating means converting said ramp signal into address signals, in synchronism with said conversion timing signal, and providing a conversion complete signal;

signal gate means, operatively connected to said first latch means and to said address signal generating means, for receiving said temporarily stored input digital data and said address signals, for gating said temporarily stored input digital data and said address signals; and writing means, operatively connected to said read out means, to said address signal generating means, to said signal gate means, and to said data memory, for receiving said conversion complete signal, said address signals, said horizontal sync signal, and for providing a gate control signal for controlling said signal gate means, and for providing a first and second write signal for writing said temporarily stored input digital data into said data memory.

22. A waveform display apparatus operatively connected to an analog signal, said apparatus comprising:

analog to digital conversion means, operatively connected to the analog signal and having an output, for converting said analog signal into input digital data;

a data memory, operatively connected to said analog to digital conversion means, for storing said input digital data, said data memory having a specified number of addresses corresponding to a specified number of storage locations;

read out means, operatively connected to said analog to digital conversion means and to said data memory, for generating as outputs, clock signal having a specified duty cycle, horizontal sync signal, a vertical sync signal, and for repeatedly reading said input digital data out of said data memory in synchronism with said horizontal and vertical sync signals;

scanning line number generating means, operatively connected to said read out means, for generating, as an output a scanning line number signal;

delay means, operatively connected to said data memory and to said read out means, for delaying the data read out of said data memory for a predetermined time corresponding to the time between two successive read outs of said data memory by said read out means;

a first comparator, having first and asecond data inputs respectively and operatively connected to said delay means and to said scanning line number generating means, for generating a first output responsive to the coincidence of said first and second data inputs, and a second data output responsive to the non-coincidence of said first and second data inputs;

a second comparator, having first and second data inputs respectively and operatively connected to said delay means and to said scanning line number generating means, for generating an output responsive to said first input of said second comparator being greater than said second data input of said second comparator;

a third comparator, having first and second inputs operatively connected to said second output of said first comparator and to said output of said second comparator, respectively, and having an output responsive to a predetermined state of said first and second inputs of said third comparator, for comparing said second output of said first compartor with said output of said second comparator;

first gate means, operatively connected between said output of said second comparator and said second input of said third comparator, having a first input operatively connected to said output of said second comparator, and an output operatively connected to said second input of said third comparator, for gating said output of said second comparator;

first operating means, having an output operatively connected to a second input of said first gate means, for controlling said first gate means;

first signal combining means, operatively connected to said first output of said first comparator and to said output of said third comparator, and an output, for combining said output of said first comparator and said output of said third comparator, second gate means, having a first input operatively connected to said output of said first signal combining means, and an output, for gating said output of said first signal combining means;

third gate means, having a first input operatively connected to said clock signal, and an output operatively connected to a second input of said second gate means, for gating said clock signal;

second operating means, having an output operatively connected to a second input of said third gate means, for controlling said third gate means;

second signal combining means, having a plurality of inputs, one of said plurality of inputs operatively connected to said output of said second gate means, for combining said plurality of inputs, to provide, as an output, a video signal;

a raster scan-type display unit, operatively connected to receive said horizontal sync signal and said vertical sync signal and said vertical sync signal of said read out means, and having an input operatively connected to said video signal, raster scan-type display unit having a display surface with a specified number of main scanning lines, each of the said main scanning lines having a specified number of picture elements, said display surface being raster scanned in accordance with said video signal, each of said picture elements being optically displayed on the display surface.

23. A waveform display apparatus according to claim 22, wherein said specified number of addresses is the same as said specified number of picture elements of one of said main scanning lines, each of said specified number of storage locations having a storage capacity corresponding to said specified number of scanning lines of said display surface of said raster scan-type display unit.

24. A waveform display apparatus according to claim 22, wherein said specified number of addresses is the same as specified number of picture elements of one of said main scanning lines, each of said specified number of storage locations having a storage capacity corresponding to said specified number of scanning lines of said display surface of said raster scan-type display unit.

25. A waveform display apparatus according to claim 22, wherein said third comparator comprises an exclusive OR gate operatively connected to said second output of said first comparator and said output of said second comparator, and having an output operatively connected to said second input of said third comparator.

26. A waveform display apparatus according to claim 22, wherein said predetermined state of said first and second inputs of said third comparator is a state of non-coincidence.

27. A waveform display apparatus according to claim 22, wherein said predetermined state of said first and second inputs of said third comparator is a state of coincidence.

28. A waveform display apparatus according to claim 22, 24, 25, 26, or 27, having means for receiving character signals, wherein said second signal combining means has a second input, said apparatus further comprises:
   a character memory, operatively connected to receive said clock signal, said horizontal sync signal, and said vertical sync signal, for storing the character signals; and
   a character generator, operatively connected to said read out means and to said character memory, for receiving said clock signal, said horizontal sync signal, said vertical sync signal, and the character signals from said character memory, said character generator converting said character signals to a video signal and providing said video signal to said second input of said second signal combining means.

29. A waveform display apparatus according to claim 28, further comprising a keyboard for generating the character signals.

30. A waveform display apparatus according to claim 28, wherein said second signal combining means has a third input, said apparatus further comprising:
   scale signal generating means, operatively connected to said read out means, for receiving said clock signal and said horizontal sync signal, for generating, as an output, a scale signal, and providing said scale signal to said third input of said second signal combining means.

* * * * *

UNITED STATES PATENT AND TRADEMARK OFFICE
CERTIFICATE OF CORRECTION

PATENT NO. : 4,464,656

DATED : August 7, 1984

INVENTOR(S) : Nakamura

It is certified that error appears in the above-identified patent and that said Letters Patent is hereby corrected as shown below:

```
Column 1, line 29, "51-9114" should be --51-91134--;
          line 61, "51-9114" should be --51-91134--.
Column 20, line 8, "gaving" should be --having--.
```

Signed and Sealed this

Thirtieth Day of April 1985

[SEAL]

Attest:

DONALD J. QUIGG

Attesting Officer

Acting Commissioner of Patents and Trademarks